United States Patent
Brief et al.

(10) Patent No.: US 10,502,780 B2
(45) Date of Patent: Dec. 10, 2019

(54) SELECTIVE EVENT FILTERING

(71) Applicant: WESTERN DIGITAL TECHNOLOGIES, INC., San Jose, CA (US)

(72) Inventors: David Chaim Brief, Modi'in (IL); Refael Ben-Rubi, Rosh Haayin (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/825,490

(22) Filed: Nov. 29, 2017

(65) Prior Publication Data

US 2018/0348300 A1    Dec. 6, 2018

Related U.S. Application Data

(63) Continuation-in-part of application No. 15/614,044, filed on Jun. 5, 2017.

(51) Int. Cl.
| | |
|---|---|
| *G06F 11/00* | (2006.01) |
| *G01R 31/317* | (2006.01) |
| *G06F 11/36* | (2006.01) |
| *G06F 11/27* | (2006.01) |

(52) U.S. Cl.
CPC ........ *G01R 31/31705* (2013.01); *G06F 11/27* (2013.01); *G06F 11/3636* (2013.01); *G06F 11/3656* (2013.01); *G06F 11/3624* (2013.01)

(58) Field of Classification Search
CPC .......................... G06F 11/3476; G06F 11/3636
See application file for complete search history.

(56) References Cited

U.S. PATENT DOCUMENTS

| | | | | |
|---|---|---|---|---|
| 4,108,359 | A * | 8/1978 | Proto | G06F 11/25 714/50 |
| 6,530,076 | B1 * | 3/2003 | Ryan | G06F 11/28 712/227 |
| 6,662,314 | B1 | 12/2003 | Iwata et al. | |
| 8,359,584 | B2 | 1/2013 | Rao et al. | |
| 8,589,890 | B2 * | 11/2013 | Eccles | G06F 11/3636 711/117 |
| 8,850,398 | B1 * | 9/2014 | L'Heureux | G06F 11/3692 705/7.25 |
| 2003/0046610 | A1 * | 3/2003 | Yamamoto | G06F 11/28 714/34 |
| 2005/0063300 | A1 * | 3/2005 | Dominic | H04L 29/12292 370/216 |
| 2006/0048012 | A1 | 3/2006 | Barton et al. | |

(Continued)

OTHER PUBLICATIONS

Office Action dated Feb. 8, 2019, in U.S. Appl. No. 15/614,044.

(Continued)

*Primary Examiner* — Christopher S McCarthy
(74) *Attorney, Agent, or Firm* — Vierra Magen Marcus LLP

(57) ABSTRACT

An apparatus includes an event message generator configured to generate an event message. The apparatus further includes a filter circuit configured to receive the event message and to send a first portion of the event message to a destination device. The filter circuit is further configured to selectively send a second portion of the event message to the destination device at least partially based on an event traffic load associated with the destination device.

20 Claims, 7 Drawing Sheets

(56) References Cited

U.S. PATENT DOCUMENTS

| | | | | |
|---|---|---|---|---|
| 2006/0085689 A1* | 4/2006 | Bjorsne | G06F 11/0748 | 714/39 |
| 2008/0282236 A1* | 11/2008 | Neft | G06F 11/28 | 717/155 |
| 2008/0316926 A1* | 12/2008 | Zhao | H04L 1/0003 | 370/232 |
| 2008/0320088 A1* | 12/2008 | Jung | H04L 51/12 | 709/206 |
| 2009/0300295 A1* | 12/2009 | Eccles | G06F 11/3636 | 711/154 |
| 2012/0079324 A1* | 3/2012 | Aphale | G06F 11/3636 | 714/26 |
| 2012/0226838 A1* | 9/2012 | Visalli | G06F 11/364 | 710/110 |
| 2014/0012864 A1* | 1/2014 | Nakagawa | G06F 16/24568 | 707/754 |
| 2014/0013011 A1* | 1/2014 | Hopkins | G06F 11/3636 | 710/14 |
| 2014/0013172 A1 | 1/2014 | Hopkins | | |
| 2014/0052930 A1* | 2/2014 | Gulati | G06F 11/22 | 711/141 |
| 2014/0068345 A1* | 3/2014 | Miller | G06F 11/3636 | 714/45 |
| 2014/0068567 A1* | 3/2014 | Smith | G06F 8/75 | 717/128 |
| 2014/0157036 A1* | 6/2014 | Walton | G06F 11/0706 | 714/2 |
| 2015/0149812 A1 | 5/2015 | Arisoylu et al. | | |
| 2017/0109258 A1* | 4/2017 | Martynov | G06F 11/3636 | |
| 2017/0139991 A1* | 5/2017 | Teletia | G06F 16/24544 | |
| 2017/0235561 A1* | 8/2017 | Butler | G06F 8/65 | 717/168 |
| 2018/0225063 A1* | 8/2018 | Singhvi | G06F 3/0656 | |

OTHER PUBLICATIONS

Response to Office Action dated Jul. 25, 2019, in U.S. Appl. No. 15/614,044.

Office Action dated Jul. 25, 2019, in U.S. Appl. No. 15/614,044.

* cited by examiner

| | Type | Source | Sub-Type | TSP | Description | | | | | | | | | | | | | | | | | | | | | | | | |
|---|---|---|---|---|---|---|---|---|---|---|---|---|---|---|---|---|---|---|---|---|---|---|---|---|---|---|---|---|---|
| | | | | | 31 30 29 | 28 27 26 25 | 24 | 23 22 21 20 19 18 17 16 15 14 13 12 11 10 9 8 7 6 5 4 3 2 1 0 |
| Event Message 656 { | FW | SRC=0,1 | Thread[4] | 0 | Event_ID24 |
| | FW | SRC=0,1 | Thread[4] | 1 | TS7 | Event_ID17 |
| | FW | SRC=0,1 | 0xF | 1 | TS24 |
| | FW | SRC=5 | fid | | TS12 | Event_ID16 |
| | FW | SRC=6 | Snif_id Sn_type | 1 | | TS16 | Event_ID8 |
| | FW | SRC=6 | Snif_id Sn_type | 0 | | | Event_ID24 |
| | HW | SRC=7 | PORT=0-1,5,8,B | 1 | | TS16 | Event_ID8 |
| | HW | SRC=7 | PORT=0-1,5,8,B | 0 | Event_ID24 (one or more such event follow with TSP=1-defined per Port and Event_ID) |
| | HW | SRC=7 | PORT=2 | 1 | | TS16 | smpl cfg | Event_ID |
| | HW | SRC=7 | PORT=2 | 0 | | counter value | smpl cfg | Event_ID |
| | HW | SRC=7 | PORT=3,4 | 1 | | TS16 | Event_ID | Event Payload |
| | HW | SRC=7 | PORT=3,4 | 0 | | sldpc parameters |
| | HW | SRC=7 | PORT=6,7 | 1 | | TS16 | Event_ID8 |
| | HW | SRC=7 | PORT=6,7,A | 0 | Event_ID24 (one or more such event follow with TSP=1-defined per Port and Event_ID) |
| | HW | SRC=7 | PORT=9,C | 1 | | TS16 | Event_ID8 |
| | FW | SRC=7 | PORT=9,C | 0 | Event_ID24 (one or more such event follow with TSP=1-defined per Port and Event_ID) |
| | FW | SRC=7 | PORT=D | 1 | TWA Type | TS7[6] | PC[20:1] of SRCO |
| | FW | SRC=7 | PORT=E | 1 | TWA Type | MS TS21 |
| | FW | SRC=7 | PORT=F | 1 | | TS24 |
| | FW | SRC=7 | PORT=F | 0 | 0xFFFF_FFE – missed event | Fifo ID |
| | FW | SRC=7 | PORT=F | 0 | 0x00000000 – no event |

FIG. 7

SELECTIVE EVENT FILTERING

CROSS-REFERENCE TO RELATED APPLICATIONS

This application is a continuation-in-part of U.S. patent application Ser. No. 15/614,044, filed Jun. 5, 2017, the entire content of which is incorporated herein by reference.

FIELD OF THE DISCLOSURE

This disclosure is generally related to system-on-chip (SOC) devices and more particularly to event logging for SOC devices. A data storage controller may be one example of an SOC device.

BACKGROUND

SOC devices may include multiple processing devices, input sensors, output displays, communication facilities, internal data processing facilities, and memory. In developing these devices, enhancing performance, and debugging problems, an overall system log may be used to determine what is happening in the device.

Information related to operation of an SOC device may be collected during a test process or during end user operation of the SOC device. For example, read and write operations may be performed by a data storage device to generate log data (also referred to herein as test data or a system log) that indicates results of the read and write operations. A test computer may analyze the log data to determine whether the data storage device operates "as expected" (e.g., in compliance with a design specification).

In some cases, generating and analyzing log data may be computationally complex. For example, generating and analyzing a large amount of log data may take days or weeks. In some cases, analyzing all of the log data may be infeasible due to an engineering deadline. Further, a large amount of log data may use storage capacity of memory components of a data storage device (which may result in an "overflow" condition in some cases) and may consume interface bandwidth of the data storage device, which may slow operation of the data storage device.

BRIEF DESCRIPTION OF THE DRAWINGS

FIG. 7 is a diagram of an illustrative example of a plurality of event messages that may be generated by the modules within the SOC device of FIG. 6 and provided to a destination device.

DETAILED DESCRIPTION

Figure 1:
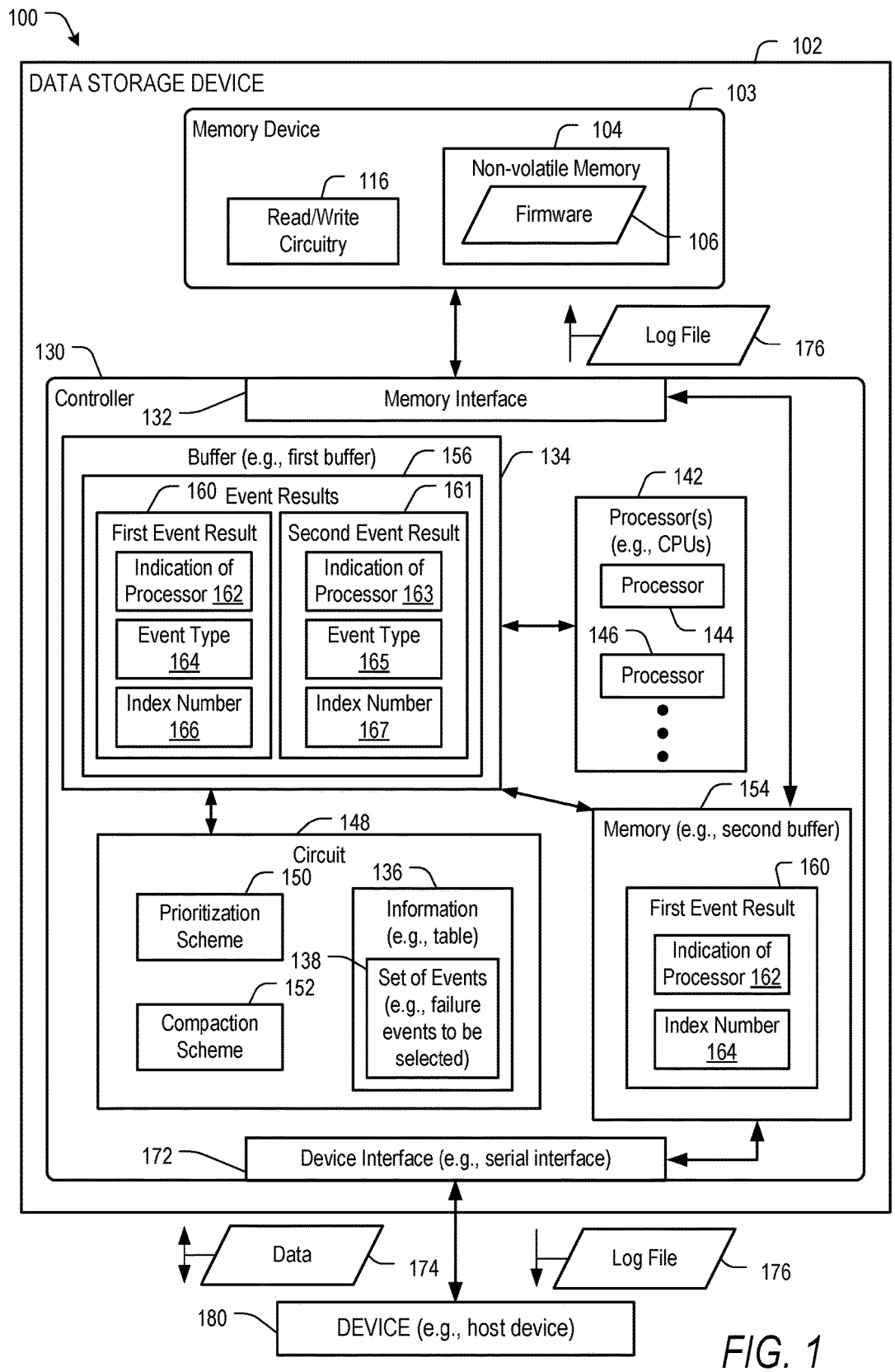
FIG. 1 is a diagram of a first illustrative example of a system including an SOC device that includes a circuit configured to perform selective event logging.

An SOC device in accordance with aspects of the disclosure includes a filter circuit configured to perform selective event filtering on a prioritized basis. The filter circuit is configured to receive an event message from an event message generator. For example, the event message generator may include a processor, a specific data path accelerator, or another data processing element. The event message may correspond to an error message that is generated in response to a failed operation initiated by the processor.

The filter circuit is configured to receive the event message, to send a first portion of the event message to a destination device, and to selectively send a second portion of the event message to the destination device at least partially based on an event traffic load associated with the destination device. To illustrate, the destination device may correspond to a non-volatile memory or a computer that is to receive the event message, and the event traffic load may correspond to a data rate used to send event traffic to the non-volatile memory or to the computer. Alternatively or in addition, the event traffic load may correspond to a storage usage of a buffer or a random access memory (RAM) of the data storage device, as illustrative examples.

In response to detecting a high event traffic load (e.g., where an event traffic metric satisfies a traffic threshold), the filter circuit may "drop" (e.g., discard) or delay one or more portions of the event message, such as by "passing" a first portion of the event message and by "dropping" a second portion of the event message. To illustrate, the first portion may include "higher priority" information, such as an indication that the first portion corresponds to a "boundary" between event messages. The second portion may include information that is "lower priority" as compared to the first portion.

By selectively filtering event messages, the filter circuit may reduce an amount of event traffic provided to a non-volatile memory, to a computer, or both. As a result, memory usage and time spent analyzing event messages may be decreased.

In another example, an SOC device is configured to identify particular event results (e.g., log data) generated during operation of the data storage device. For example, event results may be analyzed to identify "successful" events (e.g., event results that indicate "expected" operation of the data storage device) and "failed" events (e.g., event results that indicate one or more failure conditions of the data storage device). Events may be generated during firmware execution by one or more processors of the data storage device, during operation of hardware of the data storage device, or both. To illustrate, event results may be generated during device operations such as address translation, generation or accessing of metadata (e.g., headers), non-volatile memory configuration operations, or intra-device communication operations (e.g., communications between one or more processors, one or more memories, or a non-volatile memory of the data storage device).

The data storage device may be configured to selectively delete event results of "successful" events and to "pass" or keep event results of failed events, such as by providing the event results of failed events to a test device or to a non-volatile memory of the data storage device to be read out in response to a request (e.g., from a host device). As a result, a data size of the log data may be reduced, which may simplify analysis of the log data. Further, a storage capacity of a memory used to store the log data may be reduced, which may decrease size, complexity, and manufacturing cost associated with the data storage device.

Particular aspects of the disclosure are described below with reference to the drawings. In the description, common or similar features may be designated by common reference numbers. As used herein, "exemplary" may indicate an example, an implementation, and/or an aspect, and should not be construed as limiting or as indicating a preference or a preferred implementation.

Referring to FIG. 1, a first illustrative example of a system is depicted and generally designated 100. The system 100 includes a data storage device 102 (e.g., an apparatus) and a device 180 (e.g., a host device or an access device). The data storage device 102 includes a memory device 103 (e.g., one or more memory dies) and a controller 130. The controller 130 is coupled to the memory device 103. In some implementations, the data storage device 102 is integrated within the device 180, such as in connection with a solid-state drive (SSD) implementation. In a particular example, the controller 130 corresponds to a system-on-chip (SOC) device.

The memory device 103 includes read/write circuitry 116 and a non-volatile memory 104, such as a non-volatile array of storage elements included in one or more memory dies. The non-volatile memory 104 may include a flash memory (e.g., a NAND flash memory) or a resistive memory, such as a resistive random access memory (ReRAM), as illustrative examples. The non-volatile memory 104 may have a three-dimensional (3D) memory configuration. As used herein, a 3D memory device may include multiple physical levels of storage elements (instead of having a single physical level of storage elements, as in a planar memory device). As an example, the non-volatile memory 104 may have a 3D vertical bit line (VBL) configuration. In a particular implementation, the non-volatile memory 104 is a non-volatile memory having a 3D memory array configuration that is monolithically formed in one or more physical levels of arrays of memory cells having an active area disposed above a silicon substrate. Alternatively, the non-volatile memory 104 may have another configuration, such as a two-dimensional (2D) memory configuration or a non-monolithic 3D memory configuration (e.g., a stacked die 3D memory configuration).

The non-volatile memory 104 includes one or more regions of storage elements. An example of a storage region is a block, such as a NAND flash erase group of storage elements, or a group of resistance-based storage elements in a ReRAM implementation. Another example of a storage region is a word line of storage elements (e.g., a word line of NAND flash storage elements or a word line of resistance-based storage elements). A storage region may have a single-level-cell (SLC) configuration, a multi-level-cell (MLC) configuration, or a tri-level-cell (TLC) configuration, as illustrative examples. Each storage element of the non-volatile memory 104 may be programmable to a state (e.g., a threshold voltage in a flash configuration or a resistive state in a resistive memory configuration) that indicates one or more values. As an example, in an illustrative TLC scheme, a storage element may be programmable to a state that indicates three values. As an additional example, in an illustrative MLC scheme, a storage element may be programmable to a state that indicates two values.

The controller 130 includes a memory interface 132 configured to communicate with the memory device 103 and further includes a device interface 172 configured to communicate with the device 180. The controller 130 is configured to receive data 174 from the device 180 via the device interface 172, such as in connection with a request for write access to the non-volatile memory 104. The controller 130 is configured to send the data 174 (or a representation of the data 174, such as an encoded representation of the data 174) to the memory device 103 (e.g., via the memory interface 132). The memory device 103 is configured to store the data 174 to the non-volatile memory 104.

The controller 130 is configured to access the data 174 from the non-volatile memory 104. As an illustrative example, the controller 130 may receive a request for read access to the data 174. The controller 130 may send a read command to the memory device 103 to initiate reading of the data 174. In response to the read command, the memory device 103 may sense the data 174 using the read/write circuitry 116 to generate sensed data. Depending on the particular implementation, the sensed data may include a set of hard bits representing the data 174, a set of soft bits representing the data 174, or both. In some cases, the sensed data may differ from the data 174 due to one or more bit errors.

The memory device 103 may provide the sensed data to the controller 130. The controller 130 is configured to receive the sensed data from the memory device 103 (e.g., via the memory interface 132). The controller 130 may be configured to decode the sensed data (e.g., by correcting one or more bit errors of the sensed data to generate the data 174) and to provide the decoded data to the device 180.

The controller 130 further includes one or more processors 142. For example, the one or more processors 142 may include a first processor 144 and a second processor 146. In other implementations, the one or more processors 142 may include a different number of processors (e.g., one processor, three processors, or another number of processors). In an illustrative example, the one or more processors 142 correspond to central processing units (CPUs) of the controller 130. The one or more processors 142 may be configured to control operations of the data storage device 102, such as by executing firmware of the data storage device 102 to perform, initiate, or control read operations, write operations, other operations, or a combination thereof.

The one or more processors 142 are configured to execute instructions, such as firmware 106 that may be retrieved from the non-volatile memory 104 or from a memory included in the controller 130, such as a read-only memory (ROM), as illustrative examples. The firmware 106 may include operational firmware (e.g. not a test program) that may be built from multiple firmware modules and that is run by the one or more processors 142. In some implementations, the firmware 106 may include a test program, such as instructions executable by the one or more processors 142 to perform operations of a built-in self-test (BIST), as an illustrative example.

The one or more processors 142 may execute instructions of the firmware 106 to perform certain operations that either succeed or fail, such as an operation to program data to the non-volatile memory 104 that results in a successful event (e.g., upon verification of writing the data to the non-volatile memory 104) or that results in a failure event (e.g., due to a write abort). As used herein, an operation performed by the data storage device 102 may succeed (resulting in a "successful event result") or may fail (resulting in a "failure event result"). Events may be generated during execution of the firmware 106 by the one or more processors 142, during operation of hardware of the data storage device 102, or both. Illustrative examples of operations that may generate event results include operations such as address translation, generation or accessing of metadata (e.g., one or more headers or other metadata that may be included in the data 174), configuration operations to configure the non-volatile memory 104, or intra-device communication operations (e.g., communications between the one or more processors 142, one or more memories of the data storage device 102, or the non-volatile memory 104).

In the example of FIG. 1, the controller 130 further includes a first buffer, such as a buffer 134. The buffer 134 is coupled to the one or more processors 142. The example of FIG. 1 also illustrates that the controller 130 includes a circuit 148 coupled to the buffer 134 and further includes a second buffer, such as a memory 154. The memory 154 is coupled to the buffer 134. The memory 154 may include a random access memory (RAM), as an illustrative example. The memory 154 may be further coupled to an interface of the data storage device 102, such as the memory interface 132, the device interface 172, or both.

During operation, the one or more processors 142 may execute instructions of the firmware 106. The one or more processors 142 are configured to execute instructions of the firmware 106 to generate a plurality of event results 156. For example, the plurality of event results 156 may include a first event result 160 and a second event result 161. In other implementations, plurality of event results 156 may include a different number of event results (e.g., three event results, four event results, or another number of event results). In a particular illustrative example, the first event result 160 corresponds to a failed operation performed during execution of instructions of the firmware 106, and the second event result 161 corresponds to a successful operation performed during execution of the instructions of the firmware 106. The buffer 134 is configured to store the plurality of event results 156.

A particular event result of the plurality of event results 156 may include information associated with an operation that generated the event result. To illustrate, the first event result 160 may include an indication 162 (e.g., a source field) of a particular processor of the one or more processors 142 that generated the first event result 160, an event type 164 (e.g., an integer number representing a type of event) of the first event result 160, and an index number 166 (e.g., a timestamp) that indicates a time or a sequence number associated with the first event result 160. The second event result 161 may include an indication 163 (e.g., a source field) of a particular processor of the one or more processors 142 that generated the second event result 161, an event type 165 (e.g., an integer number representing a type of event) of the second event result 161, and an index number 167 (e.g., a timestamp) that indicates a time or a sequence number associated with the second event result 161.

In the example of FIG. 1, the circuit 148 is configured to select the first event result 160 of the plurality of event results 156 based on a filtering policy that indicates a particular set of event results to be provided to the memory 154. To illustrate, the filtering policy may indicate that failure event results are to be provided to the memory 154 and that successful event results are to be excluded (or "filtered") from being provided to the memory 154. In this case, event results corresponding to "expected behavior" of the data storage device 102 may be excluded from being provided to the memory 154, and event results corresponding to "unexpected behavior" may be provided to the memory 154. As a non-limiting illustrative example, the filtering policy may indicate that event results of successful write operations to the non-volatile memory 104 are to be excluded from being provided to the memory 154 (and that event results of unsuccessful write operations to the non-volatile memory 104 are to be provided to the memory 154).

To further illustrate, the circuit 148 may be configured to delete particular event results of the plurality of event results 156 based on information 136. For example, the information 136 may correspond to an event table that identifies a set of events 138, such as failure event results. In this example, the circuit 148 may delete results of one or more events (e.g., the second event result 161) if the results are not indicated by the set of events 138. In this example, the circuit 148 is configured to delete the second event result 161 from the buffer 134 in response to determining that the second event result 161 is excluded from the set of events 138. In an alternate implementation, the set of events 138 may correspond to successful events, and the circuit 148 may be configured to delete the second event result 161 in response to determining that the second event result 161 is included in the set of events 138.

The buffer 134 is configured to provide the first event result 160 to the memory 154 in response to detection by the circuit 148 of a failure condition associated with the first event result 160. For example, the circuit 148 may be configured to determine that the first event result 160 is to be provided to the memory 154 based on a filtering policy that indicates a particular set of events (e.g., the set of events 138) to be provided to the memory 154. The filtering policy may indicate events (or types of events) associated with failure conditions, such as particular opcodes indicating that an event has failed. To further illustrate, the circuit 148 may be configured to determine that the second event result 161 is excluded from the particular set of events. In some implementations, the circuit 148 may provide a command to the buffer 134 that identifies the first event result 160. The command may indicate the index number 166, as an illustrative example. Alternatively or in addition, the command may indicate an address of the first event result 160. In another example, the circuit 148 may be configured to provide an enable signal to the buffer 134 to cause contents of the buffer 134 to be output to the memory 154. To illustrate, the circuit 148 may assert the enable signal (e.g., by adjusting a value of the enable signal from a logic zero value to a logic one value, or vice versa) to cause the buffer 134 to provide the first event result 160 to the memory 154.

In a particular example, the device interface 172 is configured to receive the first event result 160 from the memory 154. For example, the first event result 160 may be included in a log file 176 that is provided from the data storage device 102 to the device 180 via the device interface 172. The log file 176 may indicate results of operations performed by the data storage device 102 (e.g., operations performed by executing the firmware 106). In some implementations, the device interface 172 includes a serializer circuit and a serial interface. The serializer circuit may be configured to receive the log file 176 from the memory 154 and to generate serial data representing the log file 176, and the serial interface may be configured to provide the serial data to the device 180.

Alternatively or in addition to providing the first event result 160 to the device 180, the data storage device 102 may be configured to store the first event result 160 to the non-volatile memory 104. For example, the memory interface 132 may be configured to receive the first event result 160 from the memory 154 and to provide the log file 176 to the memory device 103 to be stored at the non-volatile memory 104. For example, the data storage device 102 may "back up" one or more copies of the log file 176. In some cases, the log file 176 may be read from the non-volatile memory 104 and may be provided to the device 180 (e.g., in response to a request for the log file 176 from the device 180).

In some implementations, the circuit 148 is configured to delete the second event result 161 from the buffer 134 based on a prioritization scheme 150. The prioritization scheme 150 may indicate priority of certain events. For example, the circuit 148 may delete the second event result 161 from the buffer 134 prior to deleting a third event result from the buffer 134 in response to determining, based on the prioritization scheme 150, that the second event result 161 has a lower priority than the third event result.

Alternatively or in addition to the prioritization scheme 150, the circuit 148 may be configured to delete the second event result 161 based on an identification of a particular processor of the one or more processors 142, such as based on the indication 162 or the indication 163. To illustrate, if event results associated with the first processor 144 are successful (e.g., confirming that the first processor 144 operates "as expected"), then each event result associated with the first processor 144 may be deleted from the memory 154. To further illustrate, the first processor 144 may be associated with an identification (ID) of "0," and the second processor 146 may be associated with an ID of "1." In this example, if operation of the first processor 144 is confirmed, the second event result 161 may be deleted from the buffer 134 in response to the indication 163 corresponding to "0."

Alternatively or in addition, the circuit 148 may be configured to delete the second event result 161 based on the index number 167 of the second event result 161. For example, in some cases, the data storage device 102 may perform a function that is associated with multiple event results. As an illustrative example, an operation to access a cache (e.g., a cache of the memory device 103 or a cache of the controller 130) may generate multiple event results, such as an event result associated with obtaining access to the cache and another event result associated with a read operation to the cache or a write operation to the cache. In this case, upon determination that the function is completed, multiple event results corresponding to the function may be deleted from the buffer 134. For example, in some implementations, the second event result 161 may indicate a "group number" that identifies the function, and the second event result 161 may be deleted based on the group number. In another example, the multiple event results may be deleted based on one or more of an indication of a processor that performed the function, an event type of the multiple event results, index numbers associated with the multiple event results, one or more other criteria, or a combination thereof. To illustrate, if a function performed by the first processor 144 is initiated at time 0 and is completed successfully at time 10, the circuit 148 may delete the second event result 161 from the buffer 134 based on the indication 163 corresponding to the first processor 144, based on the event type 165 corresponding to an operation of the function, and based on the index number 167 being within the range of time 0 and time 10.

Alternatively or in addition, the circuit 148 may be configured to perform operations at the buffer 134 based on a compaction scheme 152. For example, after deleting the second event result 161 from the buffer 134, the circuit 148 may copy (or "move") a third event result. To further illustrate, the buffer 134 may include a first address and a second address, where the first address is associated with the second event result 161. After deleting the second event result 161 from the first address, the circuit 148 may perform a compaction process by copying the third event result from the second address to the first address. In an illustrative example, the compaction process is performed as a background process (e.g., during performance of other operations at the data storage device 102).

In an illustrative example, a data capacity of the memory 154 is based on a number of events indicated by the information 136 (e.g., a table). For example, if the set of events 138 includes a relatively small number of events to be "passed" to the memory 154, a data capacity of the memory 154 may be decreased. Alternatively, if the set of events 138 includes a larger number of events to be "passed" to the memory 154, a data capacity of the memory 154 may be increased.

One or more aspects described with reference to FIG. 1 may improve device operation or may reduce device manufacturing cost or device complexity. For example, by selectively providing the first event result 160 to the memory 154 (e.g., upon deleting the second event result 161), a size of the log file 176 may be reduced as compared to technique that copies the entire contents of the buffer 134 to the memory 154. As a result, a storage capacity of the memory 154 may be reduced, which may reduce manufacturing cost or complexity of the data storage device 102.

Further, in some cases, reduced size of the log file 176 may enable use of an efficient technique to provide the log file 176 to the device 180. For example, in some cases, a device may use a relatively large parallel interface to send an entire log file to a testing computer (since sending the entire log file to the testing computer using a serial interface may use a large amount of time). By reducing a size of the log file 176, the data storage device 102 may send the log file 176 using a serial interface in a relatively small amount of time. As a result, a number of connections of the device interface 172 may be reduced, which may reduce manufacturing cost or complexity of the data storage device 102.

Figure 2:
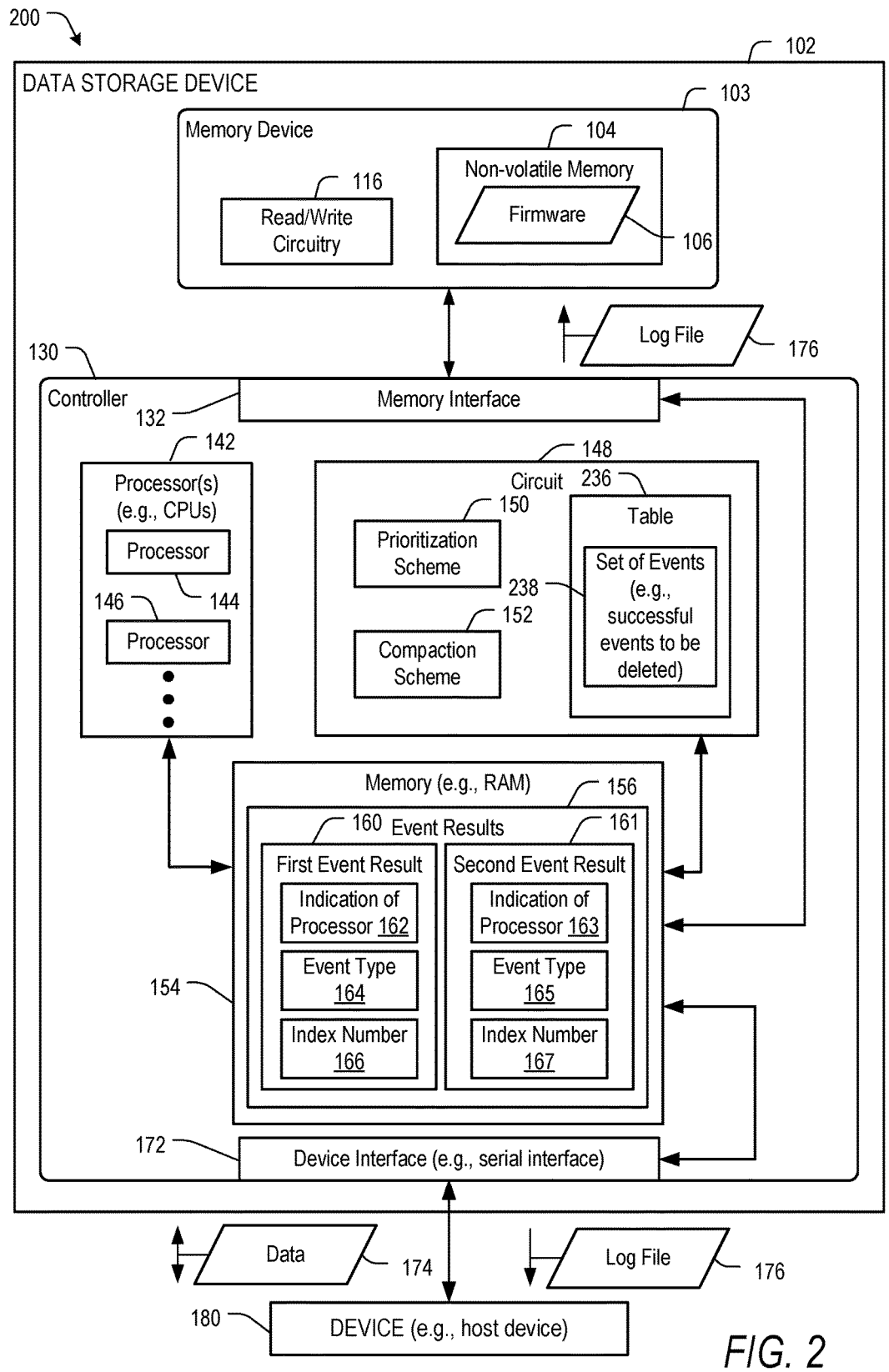
FIG. 2 is a diagram of a second illustrative example of a system including an SOC that includes a circuit configured to perform selective event logging.

Referring to FIG. 2, a second illustrative example of a system is depicted and generally designated 200. The system 200 includes the data storage device 102 and the device 180. In the second example of FIG. 2, the buffer 134 of FIG. 1 may be omitted from the data storage device 102. For example, in FIG. 2, the one or more processors 142 may be coupled to the memory 154 (instead of being coupled to the buffer 134). The second example of FIG. 2 may correspond to an implementation in which event results are provided directly to the memory 154 by the one or more processors 142 (e.g., instead of buffering the event results at the buffer 134).

During operation, the one or more processors 142 may execute instructions to generate the plurality of event results 156. For example, the one or more processors 142 may execute instructions of the firmware 106 to generate the plurality of event results 156. Alternatively or in addition, one or more event results may be generated by a hardware module, by a "sniffer" circuit or device (e.g., a bus sniffer circuit), by one or more other circuits or devices, or any combination thereof. The plurality of event results includes the first event result 160 and the second event result 161.

The controller 130 may be configured to store the plurality of event results 156 at the memory 154. In the example of FIG. 2, the circuit 148 is configured to access a table 236 to determine one or more event results of the plurality of event results 156 to be discarded (e.g., deleted) from the memory 154. To illustrate, the table 236 may indicate a set of events 238, such as successful events that correspond to "expected" behavior of the data storage device 102. The circuit 148 may be configured to delete the second event result 161 from the memory 154 in response determining that the table 236 indicates an event corresponding to the second event result 161 (e.g., in response to identifying the event corresponding to the second event result 161 in the set of events 238).

After deleting one or more event results (e.g., the second event result 161) from the memory 154, one or more event results may be provided from the memory 154 to one or more other devices or device components. For example, the log file 176 may include the first event result 160, and the log file 176 may be provided to the device 180 via the device interface 172, to the memory device 103 via the memory interface 132, or both.

In some implementations, the circuit 148 is configured to delete the second event result 161 from the memory 154 based on the prioritization scheme 150. The prioritization scheme 150 may indicate priority of certain events. For example, the circuit 148 may delete the second event result 161 from the memory 154 prior to deleting a third event result from the memory 154 in response to determining, based on the prioritization scheme 150, that the second event result has a lower priority than the third event result.

Alternatively or in addition to the prioritization scheme 150, the circuit 148 may be configured to delete the second event result 161 based on an identification of a particular processor of the one or more processors 142, such as based on the indication 162 or the indication 163. To illustrate, if event results associated with the first processor 144 are successful (e.g., confirming that the first processor 144 operates "as expected"), then each event result associated with the first processor 144 may be deleted from the memory 154. To further illustrate, the first processor 144 may be associated with an ID of "0," and the second processor 146 may be associated with an ID of "1." In this example, if operation of the first processor 144 is confirmed, the second event result 161 may be deleted from the memory 154 in response to the indication 163 corresponding to "0."

Alternatively or in addition, the circuit 148 may be configured to delete the second event result 161 based on the index number 167 of the second event result. For example, in some cases, the data storage device 102 may perform a function that is associated with multiple event results. As an illustrative example, an operation to access a cache (e.g., a cache of the memory device 103 or a cache of the controller 130) may generate multiple event results, such as an event result associated with obtaining access to the cache and another event result associated with a read operation to the cache or a write operation to the cache. In this case, upon determination that the function is completed, multiple event results corresponding to the function may be deleted from the memory 154. For example, in some implementations, the second event result 161 may indicate a "group number" that identifies the function, and the second event result 161 may be deleted based on the group number. In another example, the multiple event results may be deleted based on one or more of an indication of a processor that performed the function, an event type of the multiple event results, index numbers associated with the multiple event results, one or more other criteria, or a combination thereof. To illustrate, if a function performed by the first processor 144 is initiated at time 0 and is completed successfully at time 10, the circuit 148 may delete the second event result 161 from the memory 154 based on the indication 163 corresponding to the first processor 144, based on the event type 165 corresponding to an operation of the function, and based on the index number 167 being within the range of time 0 and time 10.

Alternatively or in addition, the circuit 148 may be configured to perform operations at the memory 154 based on the compaction scheme 152. For example, after deleting the second event result 161 from the memory 154, the circuit 148 may copy (or "move") a third event result. To further illustrate, the memory 154 may include a first address and a second address, where the first address is associated with the second event result 161. After deleting the second event result 161 from the first address, the circuit 148 may perform a compaction process by copying the third event result from the second address to the first address. In an illustrative example, the compaction processor is performed as a background process (e.g., during performance of other operations to write event results to the memory 154 or to delete event results from the memory 154).

In an illustrative example, a data capacity of the memory 154 is based on a number of events indicated by the table 236. For example, if the set of events 238 includes a relatively large of events to be deleted from the memory 154, a data capacity of the memory 154 may be decreased. Alternatively, if the set of events 238 includes a smaller number of events to be deleted from the memory 154, a data capacity of the memory 154 may be increased.

The example of FIG. 2 illustrates that event results may be provided selectively by deleting one or more event results from the memory 154. As a result, a size of the log file 176 may be reduced, which may enable reduced storage capacity of the memory 154, as an illustrative example.

Figure 3:
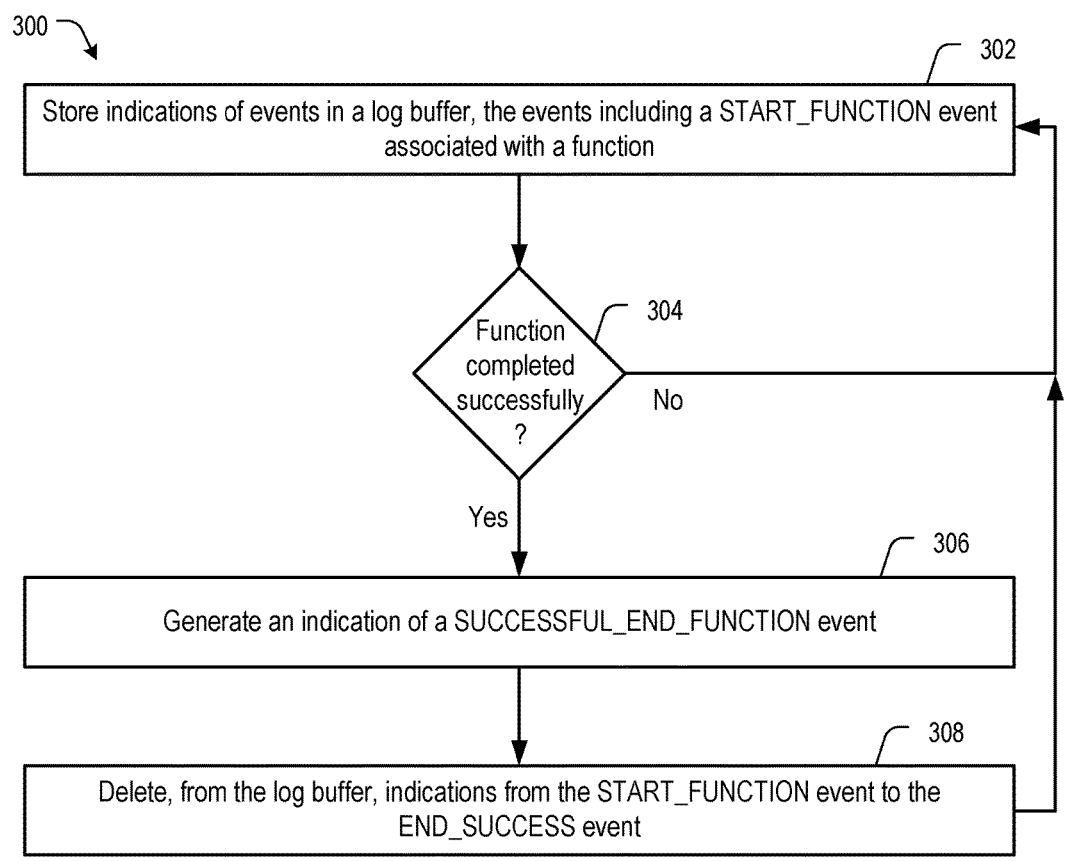
FIG. 3 is a flow chart of a particular illustrative example of a method of operation of the device of FIG. 1, the device of FIG. 2, or both.

Referring to FIG. 3, an illustrative example of a method is depicted and generally designated 300. The method 300 may be performed by the data storage device 102 of FIG. 1 or by the data storage device 102 of FIG. 2, as illustrative examples.

The method 300 includes storing indications of events in a log buffer, at 302. The events include a START_FUNCTION event associated with a function. As used herein, a "log buffer" may refer to a hardware buffer, such as the buffer 134 of FIG. 1, or to a logical buffer, such as a logical buffer corresponding to the log file 176.

A START_FUNCTION event may correspond to an event of a function that indicates another event of the function is to follow. For example, a START_FUNCTION event may correspond to an operation to access a cache (e.g., to read from the cache or to write to the cache). The operation to access the cache may be followed with an event that indicates the operation to read the cache has been successful (SUCCESSFUL_END_FUNCTION) or that the operation to read the cache has failed (FAILED_END_FUNCTION). In a particular example, the one or more processors 142 execute instructions of the firmware 106 to generate an event result of the plurality of event results 156 that indicates the START_FUNCTION event.

To further illustrate, Table 1 illustrates certain aspects that may be associated with the method 300. The leftmost column of Table 1 includes function names, such as function names corresponding to the index numbers 166, 167 of FIG. 1. The middle column of Table 1 includes events that indicate a function has been initiated (or "entered") (START_FUNCTION), and the rightmost column of Table 1 includes events that indicate a function has been completed successfully (or "exited"). In some cases, Table 1 corresponds to a table stored by the controller 130. For example, Table 1 may correspond to the table 236 of FIG. 2, and entries of Table 1 may correspond to the set of events 238.

TABLE 1

| Function name | Event at entry to function "START_FUNCTION" | Event at exit from function "SUCCESSFUL_END_FUNCTION" |
| --- | --- | --- |
| f_Read_cache | ENTERED_READ_CACHE | EXIT_READ_CACHE |
| f_Read_wo_cache | ENTERED_READ_WO_CACHE | EXIT_READ_WO_CACHE |
| f_Write_cache | ENTERED_WRITE_CACHE | EXIT_WRITE_CACHE |
| f_Write_wo_cache | ENTERED_WRITE_WO_CACHE | EXIT_WRITE_WO_CACHE |

The method 300 includes determining whether the function has been completed successfully, at 304. For example, if the function is to read from (or write to) a cache, then the function has been completed successfully upon reading to (or writing from) the cache. In this example, the function may be unsuccessful if the cache has not been read from (or written to) successfully, such as if access is "blocked" by another operation to the cache, as an illustrative example.

The method 300 further includes generating an indication of a SUCCESSFUL_END_FUNCTION event, at 306. For example, the one or more processors 142 may execute instructions of the firmware 106 to generate an event result of the plurality of event results 156 that indicates the function is successful.

The method 300 further includes deleting, from the log buffer, indications from the START_FUNCTION event to the SUCCESSFUL_END_FUNCTION event, at 308. For example, because the function is completed successfully, results of the function may be deleted from the buffer 134, as described with reference to FIG. 1, or from the memory 154, as described with reference to FIG. 2. Other event results corresponding to "unexpected" behavior (e.g., results of a failed event) may be retained at the log buffer (instead of deleting the results).

Figure 4:
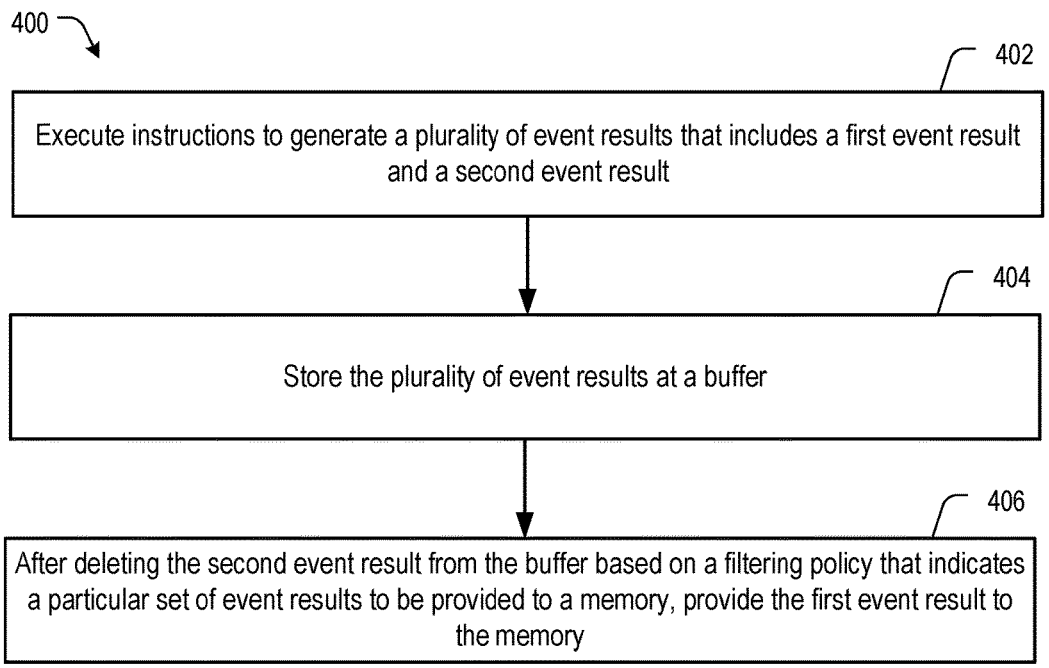
FIG. 4 is a flow chart of a particular illustrative example of a method of operation of the device of FIG. 1.

Referring to FIG. 4, an illustrative example of a method is depicted and generally designated 400. The method 400 may be performed by the data storage device 102 of FIG. 1, as an illustrative example.

The method 400 includes executing instructions to generate a plurality of event results that includes a first event result and a second event result, at 402. For example, the one or more processors 142 may execute instructions of the firmware 106 to generate the plurality of event results 156.

The method 400 further includes storing the plurality of event results at a buffer, at 404. For example, the plurality of event results 156 may be stored at the buffer 134.

The method 400 further includes providing the first event result to a memory after deleting the second event result from the buffer based on a filtering policy that indicates a particular set of event results to be provided to the memory, at 406. For example, the second event result 161 may be deleted from the buffer 134 of FIG. 1.

In a particular implementation, the set of events 138 may indicate events to be "filtered" (or excluded) from being provided to the memory 154. In this case, the second event result 161 may be deleted based on a filtering policy that indicates that event results corresponding to the set of events 138 are to be deleted from the buffer 134. In another implementation, the set of events 138 may indicate events to be "passed" to the memory 154. In this example, the second event result 161 may be deleted based on a determination that an event corresponding to the second event result 161 is not indicated by the set of events 138.

Figure 5:
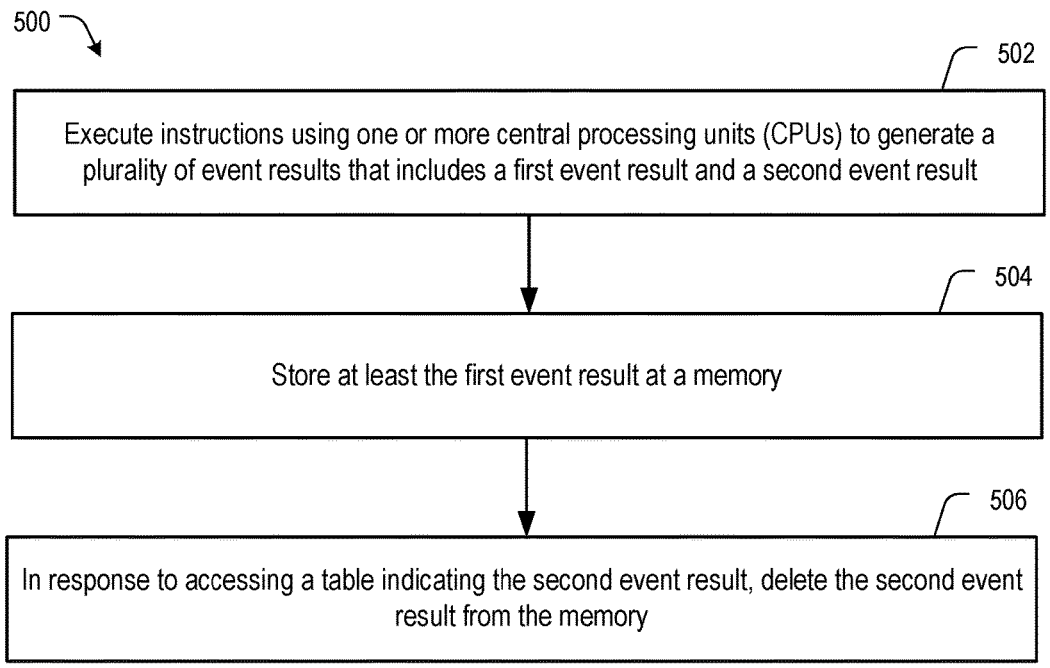
FIG. 5 is a flow chart of a particular illustrative example of a method of operation of the device of FIG. 2.

Referring to FIG. 5, an illustrative example of a method is depicted and generally designated 500. The method 500 may be performed by the data storage device 102 of FIG. 2, as an illustrative example.

The method 500 includes executing instructions using one or more CPUs to generate a plurality of event results that includes a first event result and a second event result, at 502. For example, the one or more processors 142 may execute instructions of the firmware 106 to generate the plurality of event results 156.

The method 500 further includes storing the plurality of event results at a memory, at 504. For example, the plurality of event results 156 may be stored at the memory 154.

The method 500 further includes deleting the second event result from the memory in response to accessing a table indicating the second event result, at 506. For example, the circuit 148 may be configured to delete the second event result 161 from the memory 154 in response to accessing the table 236. In this example, the set of events 238 may indicate that results of particular events are to be deleted from the memory 154. The circuit 148 may be configured to delete the second event result 161 in response to determining that the set of events 238 includes an indication of an event corresponding to the second event result 161.

In some implementations, the method 500 further includes providing the first event result to an interface after deleting the second event result from the memory. For example, the first event result 160 may be provided to the device interface 172 after deleting the second event result 161 from the memory 154. In this example, the method 500 may further include providing the first event result 160 from the device interface 172 to the device 180 after deleting the second event result 161 from the memory 154. Alternatively or in addition, the first event result 160 may be provided to the memory interface 132 after deleting the second event result 161 from the memory 154. In this example, the method 500 may further include providing the first event result 160 from the memory interface 132 to the non-volatile memory 104 after deleting the second event result 161 from the memory 154.

Figure 6:
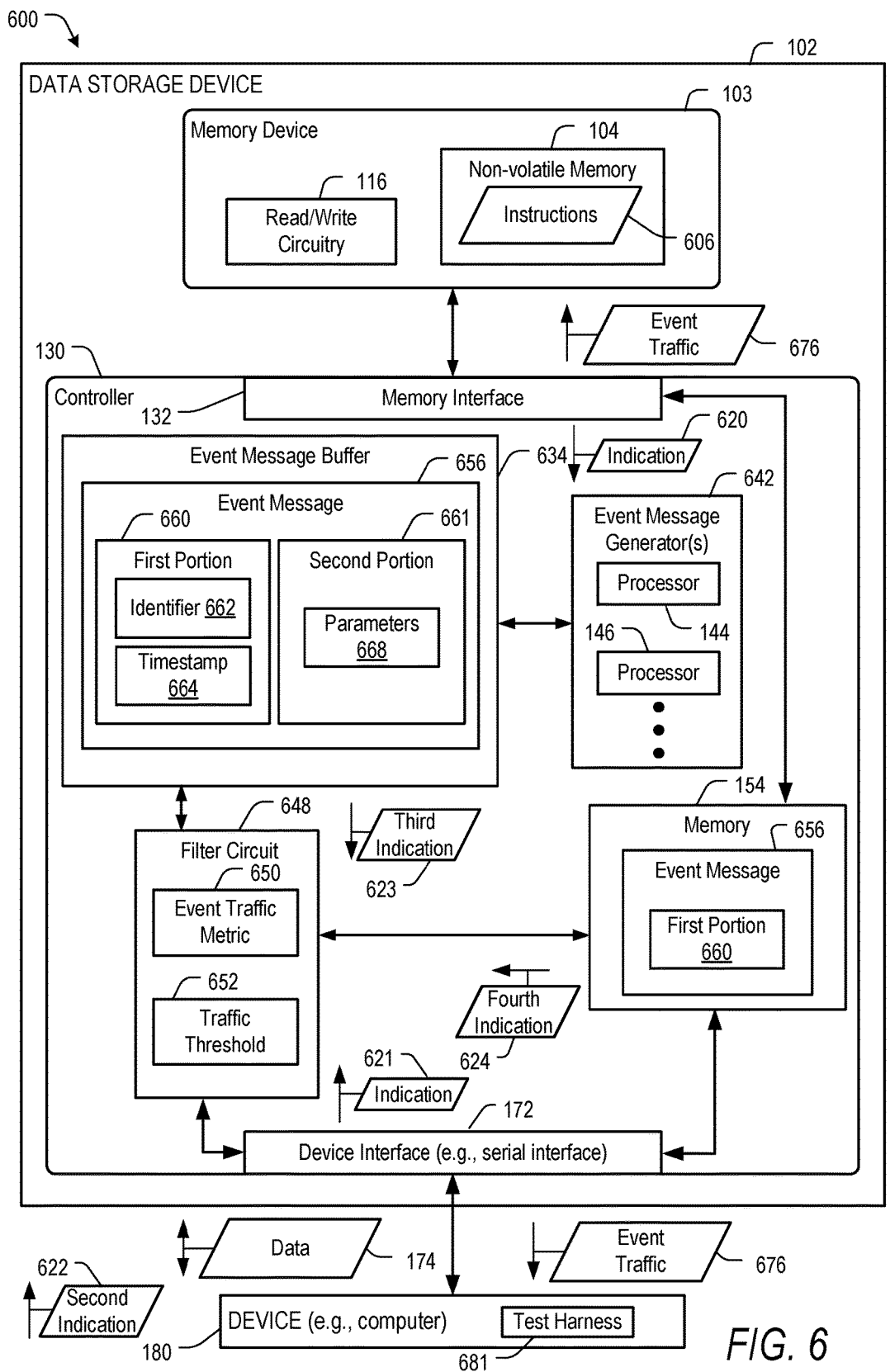
FIG. 6 is a diagram of an illustrative example of an SOC device that includes a filter circuit configured to perform selective event filtering.

Referring to FIG. 6, an illustrative example of a system to perform selective event filtering is depicted and generally designated 600. The system 600 includes the data storage device 102 and the device 180.

In the example of FIG. 6, the controller 130 includes one or more event message generators 642, such as the first processor 144 and the second processor 146. Although the example of FIG. 6 depicts that the controller 130 includes the one or more event message generators 642, it should be appreciated that the memory device 103 may include one or more event message generators (alternatively or in addition to the event message generators 642 of the controller 130).

The one or more event message generators 642 are coupled to an event message buffer 634 (e.g., the buffer 134 or another buffer). The event message buffer 634 may include one or more first-in, first-out (FIFO) buffers, as an illustrative example.

The controller 130 further includes a filter circuit 648. In FIG. 6, the filter circuit 648 is coupled to the event message buffer 634 and to the memory 154. The memory 154 is coupled to one or more interfaces, such as the memory interface 132, the device interface 172 (e.g., a serial interface), one or more other interfaces, or a combination thereof.

During operation, the data storage device 102 may generate one or more event messages. For example, an event message generator of the one or more event message generators 642 is configured to generate an event message 656. To further illustrate, the event generator may include the first processor 144 of a plurality of processors (e.g., the processors 144, 146). The first processor 144 is configured to execute instructions 606, and the event message 656 may correspond to a failed operation initiated by the first processor 144 during execution of the instructions 606. As a non-limiting illustrative example, the event message 656 may correspond to a failed read operation at the non-volatile memory 104 or a failed write operation at the non-volatile memory 104. The instructions 606 may include the firmware 106, other instructions, or a combination thereof.

The filter circuit 648 is configured to receive the event message 656. For example, the event message buffer 634 may be configured to receive the event message 656 from an event message generator (e.g., the first processor 144), and the filter circuit 648 may be configured to retrieve the event message 656 from the event message buffer 634.

The event message 656 includes multiple portions, such as a first portion 660 and a second portion 661. Although FIG. 6 depicts two portions 660, 661, in other examples, an event message may include three or more portions.

The first portion 660 may include an identifier 662 of an event (e.g., an indication of a type of failed operation) and may further include a timestamp 664 (e.g., an indication of a time or a counter value associated with the failed operation). In a particular example, the identifier 662 indicates that the first portion 660 corresponds to an event boundary between the event message 656 and another event message (e.g., a preceding event message). Alternatively or in addition, the identifier 662 may indicate a priority associated with the event message 656. The second portion 661 includes parameters 668 associated with the event, such as additional information related to the event (e.g., a "continuation" of the first portion 660 or "optional" information associated with the event message 656). To further illustrate, Table 2 depicts an example of a priority scheme that may be used by the system 600:

TABLE 2

| Priority Value | Filtering Operation |
|---|---|
| 0 | Event message should not be delayed or dropped |
| 1 | Event message may be delayed or dropped in response to event traffic load exceeding a first threshold |
| 2 | Event message may be delayed or dropped in response to event traffic load exceeding a second threshold |
| 3 | Portion(s) (e.g., parameters) of event message may be delayed or dropped |

In the example of Table 2, the left column indicates priority values ("0," "1," "2," and "3"). Each event message generated by the one or more event message generators 642 may indicate one of the priority values. A particular priority value may correspond to or may be included in the identifier 662, as an illustrative example. Although the example of Table 2 illustrates four different priority values, in other implementations, a different number of priority values may be used (e.g., two priority values or eight priority values, as illustrative examples).

The right column of Table 2 indicates whether a particular type of filtering operation may be performed based on the corresponding priority value. For example, in response to the identifier 662 indicating a priority value of "0," the event message 656 is not to be delayed or dropped (e.g., discarded). As additional examples, in response to the identifier 662 indicating a priority value of "1" or "2," the event message 656 may be delayed or dropped in response to an event traffic load satisfying (e.g., exceeding) a first threshold or a second threshold, respectively. As another example, in response to the identifier 662 indicating a priority value of "3," one or portions of the event message 656 may be delayed or dropped (e.g., discarded).

The filter circuit 648 is configured to selectively send one or more portions of event messages to a destination device (e.g., in response to the identifier 662 indicating a priority value of "3," as an illustrative example). For example, one or more portions of event messages may be included in event traffic 676 (e.g., trace data) that is provided to the destination device by the filter circuit 648. As used herein, a destination device may include one or more devices configured to receive, store, or process the event traffic 676. For example, the destination device may correspond to the device 180, the non-volatile memory 104, or both. In a particular example, the destination device includes a testing device (e.g., a test harness) that is configured to evaluate operation and performance of a device under test (e.g., the data storage device 102). For example, the device 180 may include a test harness 681 that is configured to evaluate operation and performance of the data storage device 102.

The filter circuit 648 is configured to select portions of the event message 656, such as by determining that the first portion 660 corresponds to a "high priority" portion of the event message 656 (e.g., by detecting, based on the identifier 662, that the first portion 660 corresponds to an event message boundary). The filter circuit 648 is configured to send the first portion 660 to the destination device.

The filter circuit 648 is further configured to selectively send (e.g., forward) the second portion 661 to the destination device at least partially based on an event traffic load associated with the destination device. For example, the event traffic load may correspond at least one of a first data rate used to send the event traffic 676 to the device 180 (e.g., via the device interface 172), a second data rate used to send the event traffic 676 to the non-volatile memory 104 (e.g., via the memory interface 132), a first storage usage of the event message buffer 634, or a second storage usage of the memory 154.

To further illustrate, in a particular example, the memory interface 132 is configured to send the event traffic 676 to the non-volatile memory 104 and to send an indication 620 of the event traffic load to the filter circuit 648. In this example, the non-volatile memory 104 corresponds to the destination device. The indication 620 may specify a bandwidth usage of the memory interface 132, as an illustrative example.

Alternatively or in addition, the device interface 172 may correspond to a serial interface that is configured to the send the event traffic 676 to a computer (e.g., the device 180) and to send an indication 621 of the event traffic load to the filter circuit 648. In this example, the device 180 corresponds to the destination device. The indication 621 may specify a bandwidth usage of the device interface 172, as an illustrative example.

Alternatively or in addition, the destination device may correspond to a computer (e.g., the device 180), and the filter circuit 648 may be configured to receive a second indication 622 of the event traffic load from the computer. For example, the second indication 622 may specify a number of messages received by the device 180 via the device interface 172.

Alternatively or in addition, the event traffic load may be based on a usage of a buffer or a memory of the data storage device 102. For example, the event message buffer 634 may be configured to send a third indication 623 of the event traffic load to the filter circuit 648. The third indication 623 may be based on a storage usage of the event message buffer 634. To illustrate, the third indication 623 may specify a number of messages stored at the event message buffer 634 or a remaining capacity of the event message buffer 634. As another example, the memory 154 may be configured to send a fourth indication 624 of the event traffic load to the filter circuit 648. The fourth indication 624 may be based on a storage usage of the memory 154. To illustrate, the fourth indication 624 may specify a number of messages stored at the memory 154 or a remaining capacity of the memory 154.

In some implementations, the filter circuit 648 is configured to determine an event traffic metric 650 at least partially based on an indication of the event traffic load (e.g., based on any of the indications 620-624). To illustrate, in some examples, the event traffic metric 650 may correspond to an average (e.g., a weighted average or an unweighted average) of the indications 620-624. In another example, the filter circuit 648 may be configured to select the "worst" of the indications 620-624 as the event traffic metric 650 (so that the event traffic metric 650 indicates the "worst case scenario") or to select the "best" of the indications 620-624 as the event traffic metric 650 (so that the event traffic metric 650 is an "optimistic" estimate).

The filter circuit 648 may be configured to delay or drop the second portion 661 in response to the event traffic metric 650 satisfying (e.g., exceeding) a traffic threshold 652. For example, in response to the event traffic metric 650 satisfying the traffic threshold 652, the filter circuit 648 may identify one or more portions of one or more event messages to be filtered from the event traffic 676. The one or more portions filtered from the event traffic 676 may correspond to "low priority" event traffic.

In some implementations, the filter circuit 648 is configured to "drop" the second portion 661 by deleting (or flagging for deletion) the second portion 661 from the event message buffer 634. For example, the filter circuit 648 may adjust a value of a valid bit associated with the second portion 661 from a first value (e.g., a logic one value or a logic zero value) to a second value (e.g., a logic zero value or a logic one value) to indicate that the second portion 661 is to be deleted from the event message buffer 634.

In another example, the filter circuit 648 is configured to delay providing of the second portion 661 to a destination device. For example, the filter circuit 648 may avoid sending the second portion 661 to the destination device until the event traffic metric 650 fails to satisfy the traffic threshold 652.

Although FIG. 6 depicts one traffic threshold 652, it should be appreciated that the filter circuit 648 may be configured to operate using multiple traffic thresholds. For example, the traffic threshold 652 may correspond to the first threshold described with reference to Table 2, and the filter circuit 648 may be configured to operate using another traffic threshold corresponding to the second threshold described with reference to Table 2. In some cases, each portion of an event message may be associated with a respective traffic threshold 652. In some implementations, a traffic threshold may be implicit according to a test configuration file.

The memory 154 is configured to store the first portion 660 of the event message 656. The first portion 660 may be provided to a destination device via the event traffic 676. Depending on the particular implementation, the destination device may correspond to the non-volatile memory 104, a computer (e.g., the device 180), or another device, or a combination thereof.

By selectively filtering event messages, the filter circuit 648 may reduce an amount of the event traffic 676 provided to the non-volatile memory 104, to a computer (e.g., the device 180), or both. As a result, memory usage and time spent analyzing event messages may be decreased.

FIG. 7 depicts a particular illustrative example of a plurality of event messages. The plurality of event messages of FIG. 7 includes the event message 656. Although FIG. 7 depicts a particular example of the event message 656, it should be appreciated that in other examples the event message 656 may correspond to a different event message than illustrated in FIG. 7.

In the particular example of FIG. 7, each event message includes 32 bits (bits "0" through "31"). In other implementations, an event message may include a different number of bits.

Each event message of FIG. 7 may include a type field, such as firmware ("FW") or hardware ("HW"), as illustrative examples. The type field may indicate a type of event associated with an event message, such as that an event message is caused by a "failure" condition associated with firmware or hardware.

Each event message of FIG. 7 includes a source (SRC) field. In FIG. 7, each SRC field is associated with a value ("0," "1," . . . "7"). For example, each SRC field may correspond to a particular event generator of the plurality of event message generators 642 of FIG. 6. In some cases, multiple event message generators may be associated with a particular event (e.g., where SRC=0,1). In a particular example, the SRC field of FIG. 7 corresponds to the identifier 662 of FIG. 6.

FIG. 7 also depicts that each event message may include a sub-type field. The sub-type field may include additional information related to the type field, such as by indicating a particular thread associated with the event (e.g., Thread[4]), one or more ports of the data storage device 102 associated with the event (e.g., PORT=2), an address associated with the event (e.g., 0xF), or other type or field information (e.g., "fid," "snif_id," or "sn_type"), as illustrative examples.

Event messages may also include a timestamp (TSP) field. In FIG. 7, a TSP field having a value of "1" may indicate that the event message corresponds to a "new" event (e.g., an event boundary between events), and a TSP field having a value of "0" may indicate that the event message corresponds to a "continuation" of a previous event. In a particular example, the TSP field of FIG. 7 corresponds to the timestamp 664 of FIG. 6. The filter circuit 648 of FIG. 6 may be configured to selectively forward one or more portions of an event message having a TSP field value of "1" to a destination device and to delay or drop one or more portions of an event message (or an entirety of the event message) having a TSP field value of "0."

FIG. 7 also illustrates that each event message may include a description field. To illustrate, the description field may include additional event information (e.g., Event ID24), additional timestamp information (e.g., TS7), ECC information (e.g., soft low-density parity check (SLDPC) parameters), configuration information (e.g., "smpl cfg"), counter information (e.g., counter value), additional address information (e.g., 0xFFFF_FFE), or other information, as illustrative examples. In a particular example, the description field of FIG. 7 corresponds to the parameters 668 of FIG. 6.

In a particular example, the filter circuit 648 is configured to forward to a destination device at least a portion (e.g., the first portion 660) of each event message having a particular TSP field value (e.g., a TSP field value of "1") irrespective of whether the event traffic metric 650 exceeds the traffic threshold 652. The filter circuit 648 may be configured to selectively delay or drop another portion (e.g., the second portion 661) of an event message having the particular TSP field value in response to the event traffic metric 650 exceeding the traffic threshold 652 and to forward the other portion to the destination device in response the event traffic metric failing to satisfy the traffic threshold 652. The filter circuit 648 may be configured to delay or drop an entirety of an event message having another TSP field value (e.g., a TSP field value of "0") in response to the event traffic metric 650 exceeding the traffic threshold 652 and to forward the event message to the destination device in response to the event traffic metric 650 failing to exceed the traffic threshold 652.

In some implementations, an event message may indicate information of Table 2. For example, in some implementations, an event message may include a field specifying a value indicated by the left column of Table 2. As another example, an event message may implicitly indicate information of Table 2. For example, a particular value of the left column of Table 2 may correspond to a particular combination of a SRC field value and information indicated in a sub-type field, such as one or more of a port or a thread. In a particular example, a particular combination of SRC, port, and thread values may be associated with an occupancy threshold (e.g., a particular value of the traffic threshold 652 or another threshold). In this example, an event message may implicitly indicate a priority of the event message (e.g., by indicating a particular occupancy threshold).

The example of FIG. 7 illustrates that portions of event messages may be selectively forwarded based on information indicated by the event messages. As a result, an amount of event traffic that is buffered at a data storage device and that is provided to a destination device may be reduced.

Figure 8:
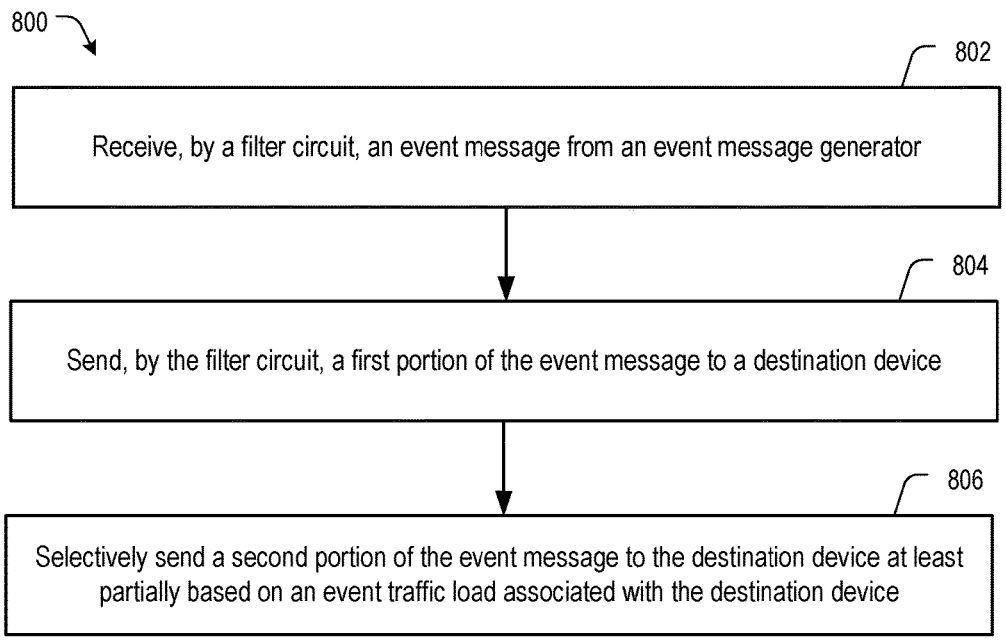
FIG. 8 is a flow chart of a particular illustrative example of a method of operation of the device of FIG. 6.

Referring to FIG. 8, an illustrative example of a method is depicted and generally designated 800. The method 800 may be performed by the data storage device 102 of FIG. 6, as an illustrative example.

The method 800 includes receiving, by a filter circuit, an event message from an event message generator, at 802. For example, the filter circuit 648 may receive the event message 656 from an event message generator of the one or more event message generators 642, such as from the first processor 144, as an illustrative example.

The method 800 further includes sending, by the filter circuit, a first portion of the event message to a destination device, at 804. For example, the filter circuit 648 may send the first portion 660 to the non-volatile memory 104, to the device 180, one or more other destination devices, or a combination thereof.

The method 800 further includes selectively sending a second portion of the event message to the destination device at least partially based on an event traffic load associated with the destination device, at 806. For example, the filter circuit 648 may selectively send the second portion 661 to the destination device based on one or more of the indications 620-624.

The method 800 of FIG. 8 illustrates that portions of event messages may be selectively provided by a data storage device to a destination device based on information indicated by the event messages. As a result, an amount of event traffic that is buffered at the data storage device and that is provided to the destination device may be reduced.

In conjunction with the described embodiments, an apparatus includes means (e.g., the one or more event message generators 642, such as the first processor 144 or the second processor 146) for generating an event message (e.g., the event message 656). The apparatus further includes means (e.g., the filter circuit 648) for forwarding a first portion (e.g., the first portion 660) of the event message to a destination device and selectively forwarding a second portion (e.g., the second portion 661) of the event message to the destination device at least partially based on an event traffic load associated with the destination device.

Although various components depicted herein are illustrated as block components and described in general terms, such components may include one or more microprocessors, state machines, or other circuits configured to enable such components to perform one or more operations described herein. For example, certain aspects of the filter circuit 648 may represent physical components, such as hardware controllers, state machines, logic circuits, or other structures, to enable the filter circuit 648 to selectively filter event results.

As an illustrative example, the filter circuit 648 may include a first comparator circuit configured to compare information of the event message 656 (e.g., the identifier 662) to first reference information (e.g., a plurality of reference values corresponding to the values of Table 2) to determine whether one or more portions of the event message 656 may be delayed or dropped. The filter circuit 648 may further include a second comparator circuit configured to determine whether the event traffic metric 650 exceeds the traffic threshold 652. The filter circuit 648 may further include a logic circuit (e.g., an AND gate or an OR gate) coupled to the first comparator circuit and to the second comparator circuit. The logic circuit may be configured to receive a first signal from the first comparator circuit indicating that one or more portions of the event message 656 may be delayed or dropped and to receive a second signal from the second comparator circuit indicating that the event traffic metric 650 exceeds the traffic threshold 652. The logic circuit may be configured to output a third signal that causes the filter circuit 648 to delay or drop the second portion 661 based on the first signal and the second signal.

Alternatively or in addition, certain aspects of the filter circuit 648 may be implemented using a microprocessor or microcontroller. In a particular embodiment, one or more aspects of the filter circuit 648 may be implemented using a processor executing instructions (e.g., firmware) that are stored at the non-volatile memory 104. Alternatively, or in addition, executable instructions that are executed by the processor may be stored at a separate memory location that is not part of the non-volatile memory 104, such as at a read-only memory (ROM) that may be included in the controller 130.

The data storage device 102 may be coupled to, attached to, or embedded within one or more accessing devices, such as within a housing of the device 180. For example, the data storage device 102 may be embedded within the device 180 in accordance with a Joint Electron Devices Engineering Council (JEDEC) Solid State Technology Association Universal Flash Storage (UFS) configuration. To further illustrate, the data storage device 102 may be integrated within an electronic device (e.g., the device 180), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the data storage device 102 may be implemented in a portable device configured to be selectively coupled to one or more external devices, such as a host device. For example, the data storage device 102 may be removable from the device 180 (i.e., "removably" coupled to the device 180). As an example, the data storage device 102 may be removably coupled to the device 180 in accordance with a removable universal serial bus (USB) configuration.

The device 180 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The device 180 may communicate via a controller, which may enable the device 180 to communicate with the data storage device 102. The device 180 may operate in compliance with a JEDEC Solid State Technology Association industry specification, such as an embedded MultiMedia Card (eMMC) specification or a Universal Flash Storage (UFS) Host Controller Interface specification. The device 180 may operate in compliance with one or more other specifications, such as a Secure Digital (SD) Host Controller specification as an illustrative example. Alternatively, the device 180 may communicate with the data storage device 102 in accordance with another communication protocol. In some implementations, the data storage device 102 may be integrated within a network-accessible data storage system, such as an enterprise data system, an NAS system, or a cloud data storage system, as illustrative examples.

In some implementations, the data storage device 102 may include a solid state drive (SSD). The data storage device 102 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 102 may be coupled to the device 180 via a network. For example, the network may include a data center storage system network, an enterprise storage system network, a storage area network, a cloud storage network, a local area network (LAN), a wide area network (WAN), the Internet, and/or another network.

To further illustrate, the data storage device 102 may be configured to be coupled to the device 180 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The non-volatile memory 104 may include a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. The non-volatile memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus comprising:
    an event message generator configured to generate an event message; and
    a filter circuit configured to:
        receive the event message;
        send a first portion of the event message to a destination device;
        selectively send a second portion of the event message to the destination device at least partially based on an event traffic metric associated with the destination device; and
        selectively delay or drop the second portion of the event message based on the event traffic metric exceeding a traffic threshold.

2. The apparatus of claim 1, wherein the destination device includes a test harness that is configured to evaluate operation and performance of a device under test that includes the event message generator and the filter circuit.

3. The apparatus of claim 1, wherein:
    the first portion includes:
        an identifier of an event; and
        a timestamp; and
    the second portion includes parameters associated with the event.

4. The apparatus of claim 1, wherein:
    the event generator includes a processor of a plurality of processors, the processor configured to execute instructions; and
    the event message corresponds to a failed operation initiated by the processor during execution of the instructions.

5. The apparatus of claim 1, further comprising an interface configured to:
   send event traffic to the destination device; and
   send an indication of an event traffic load to the filter circuit.

6. The apparatus of claim 5, wherein the filter circuit is further configured to:
   determine the event traffic metric at least partially based on the indication of the event traffic load.

7. The apparatus of claim 5, wherein:
   the destination device comprises a non-volatile memory; and
   the interface comprises a memory interface to the non-volatile memory.

8. The apparatus of claim 5, wherein:
   the destination device comprises a computer; and
   the interface comprises a serial interface.

9. The apparatus of claim 8, wherein the filter circuit is further configured to receive a second indication of the event traffic load from the computer.

10. The apparatus of claim 1, further comprising an event message buffer coupled to the event message generator, wherein the event message buffer is configured to send an indication of an event traffic load to the filter circuit, the indication based on a storage usage of the event message buffer.

11. The apparatus of claim 1, further comprising a random access memory (RAM) coupled to the filter circuit and configured to store the first portion of the event message.

12. A method comprising:
   receiving, by a filter circuit, an event message from an event message generator;
   sending, by the filter circuit, a first portion of the event message to a destination device; determining an event traffic metric associated with the destination device;
   sending the event traffic metric to the filter circuit;
   comparing, by the filter circuit, the event traffic metric with a traffic threshold; and
   sending the second portion of the event message to the destination device in response to the event traffic metric not exceeding the traffic threshold.

13. The method of claim 12, wherein the event traffic metric is based on at least one of:
   a first data rate used to send event traffic to an access device;
   a second data rate used to send the event traffic to a non-volatile memory;
   a first storage usage of a buffer that stores the event message; or
   a second storage usage of a memory that stores the first portion of the event message.

14. The method of claim 12, wherein:
   the first portion includes:
      an identifier of an event; and
      a timestamp; and
   the second portion includes parameters associated with the event.

15. The method of claim 12, further comprising executing instructions by a processor, wherein the event message corresponds to a failed operation initiated by the processor during execution of the instructions.

16. The method of claim 12, wherein the destination device corresponds to a non-volatile memory or a computer.

17. An apparatus comprising:
   means for generating an event message; and
   means for:
      forwarding a first portion of the event message to a destination device,
      selectively forwarding a second portion of the event message to the destination device at least partially based on an event traffic metric associated with the destination device, and
      selectively discarding the second portion of the event message based on the event traffic metric exceeding a traffic threshold.

18. The apparatus of claim 17, wherein the event traffic metric is based on at least one of:
   a first data rate used to send event traffic to an access device;
   a second data rate used to send the event traffic to a non-volatile memory;
   a first storage usage of a buffer configured to store the event message; or
   a second storage usage of a memory configured to store the first portion of the event message.

19. The apparatus of claim 17, wherein:
   the first portion includes:
      an identifier of an event; and
      a timestamp; and
   the second portion includes parameters associated with the event.

20. The apparatus of claim 17, wherein the destination device corresponds to a non-volatile memory or a computer.

* * * * *